United States Patent
Hartzell

(10) Patent No.: US 7,696,070 B2
(45) Date of Patent: *Apr. 13, 2010

(54) SYSTEM AND METHOD FOR DIGITAL LIGHT VALVE PROCESSING

(75) Inventor: John W. Hartzell, Camas, WA (US)

(73) Assignee: Sharp Laboratories of America, Inc, Camas, WA (US)

(*) Notice: Subject to any disclaimer, the term of this patent is extended or adjusted under 35 U.S.C. 154(b) by 336 days.

This patent is subject to a terminal disclaimer.

(21) Appl. No.: 11/524,607

(22) Filed: Sep. 21, 2006

(65) Prior Publication Data

US 2008/0009084 A1 Jan. 10, 2008

Related U.S. Application Data

(63) Continuation-in-part of application No. 11/483,431, filed on Jul. 10, 2006.

(51) Int. Cl.
*H01L 21/20* (2006.01)
(52) U.S. Cl. .................... 438/487; 438/22
(58) Field of Classification Search ........ 438/166, 438/308, 487, 22
See application file for complete search history.

(56) References Cited

U.S. PATENT DOCUMENTS 6,781,659 B2 * 8/2004 Shiota et al. ........... 349/139
2004/0259296 A1 * 12/2004 Voutsas et al. ........... 438/166

* cited by examiner

*Primary Examiner*—Brook Kebede
*Assistant Examiner*—Tony Tran
(74) *Attorney, Agent, or Firm*—Law Office of Gerald Maliszewski; Gerald Maliszewski

(57) ABSTRACT

A system and method are provided for processing a semiconductor film using a digital light valve. The method enables pixel elements from an array of selectable pixel elements; gates a light in response to enabling the pixel elements; exposes selected areas of a semiconductor film, such as Si, to the gated light; and, creates light-related reactions in the semiconductor film, in response to the light exposure. More specifically, enabling pixel elements from an array of selectable pixel elements may include: exposing a digital light valve array of selectable pixel elements to the light; enabling a pattern of pixel elements; and, transmitting light from the pattern of enabled pixel elements. Examples of light-related reactions include changing the topology of a film surface, creating a chemical reaction, diffusing a dopant, activating a dopant, alloying the semiconductor film, and changing the semiconductor crystalline structure.

17 Claims, 11 Drawing Sheets

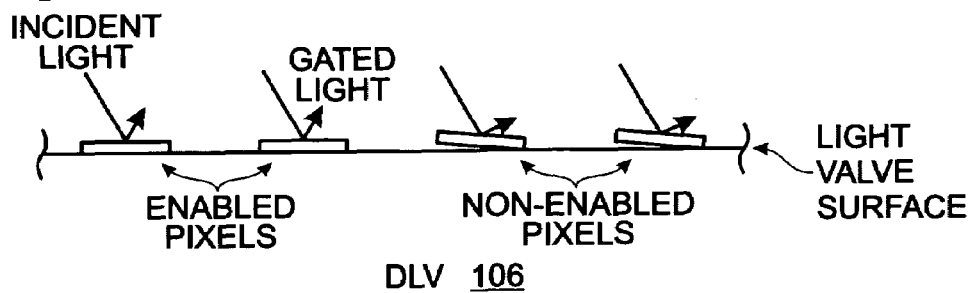
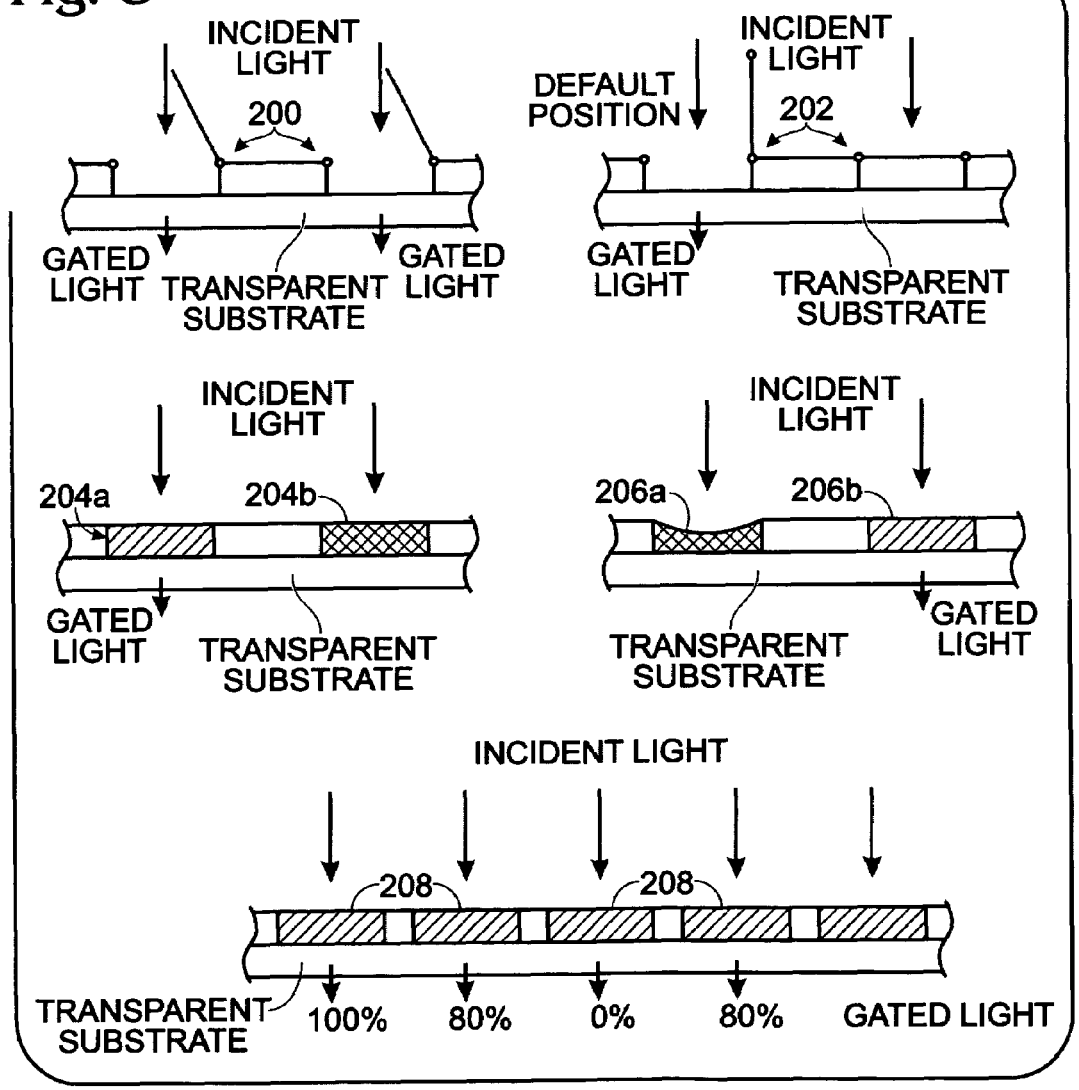

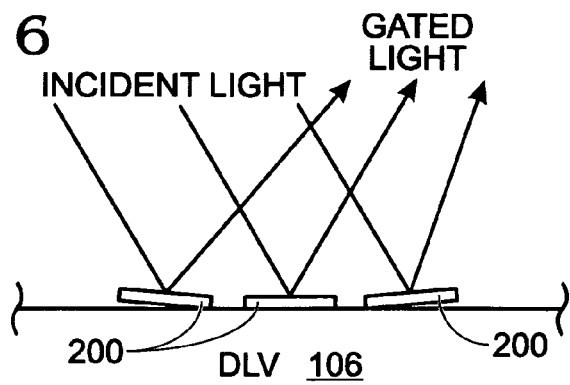
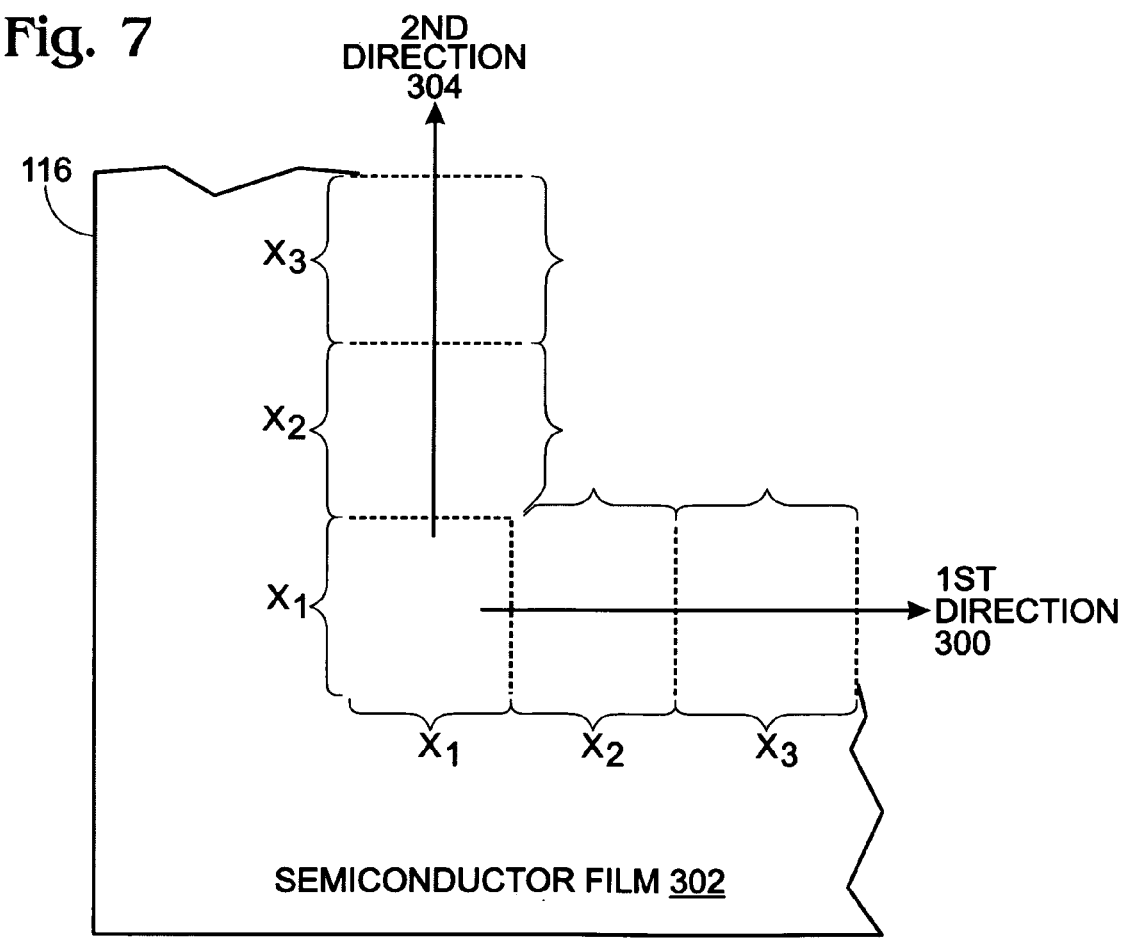

Fig. 11B

|   |   | $x_2$ | $x_2$ | $x_2$ | $x_2$ |
|---|---|---|---|---|---|
|   |   | $x_2$ | $x_1$ | $x_1$ | $x_2$ |
|   |   | $x_2$ | $x_1$ | $x_1$ | $x_2$ |
|   |   | $x_2$ | $x_2$ | $x_2$ | $x_2$ |

Fig. 11C

| x | x |   |   |   |   |   |
|---|---|---|---|---|---|---|
| x | x | x |   |   |   |   |
| x | x | x | x |   |   |   |
| x | x | x |   |   |   |   |
| x | x |   |   |   |   |   |

Fig. 11D

|   |   | x | x |   |   |   |
|---|---|---|---|---|---|---|
|   |   | x | x | x |   |   |
|   |   | x | x | x | x |   |
|   |   | x | x | x |   |   |
|   |   | x | x |   |   |   |

CENTER

FIRST RING

SECOND RING

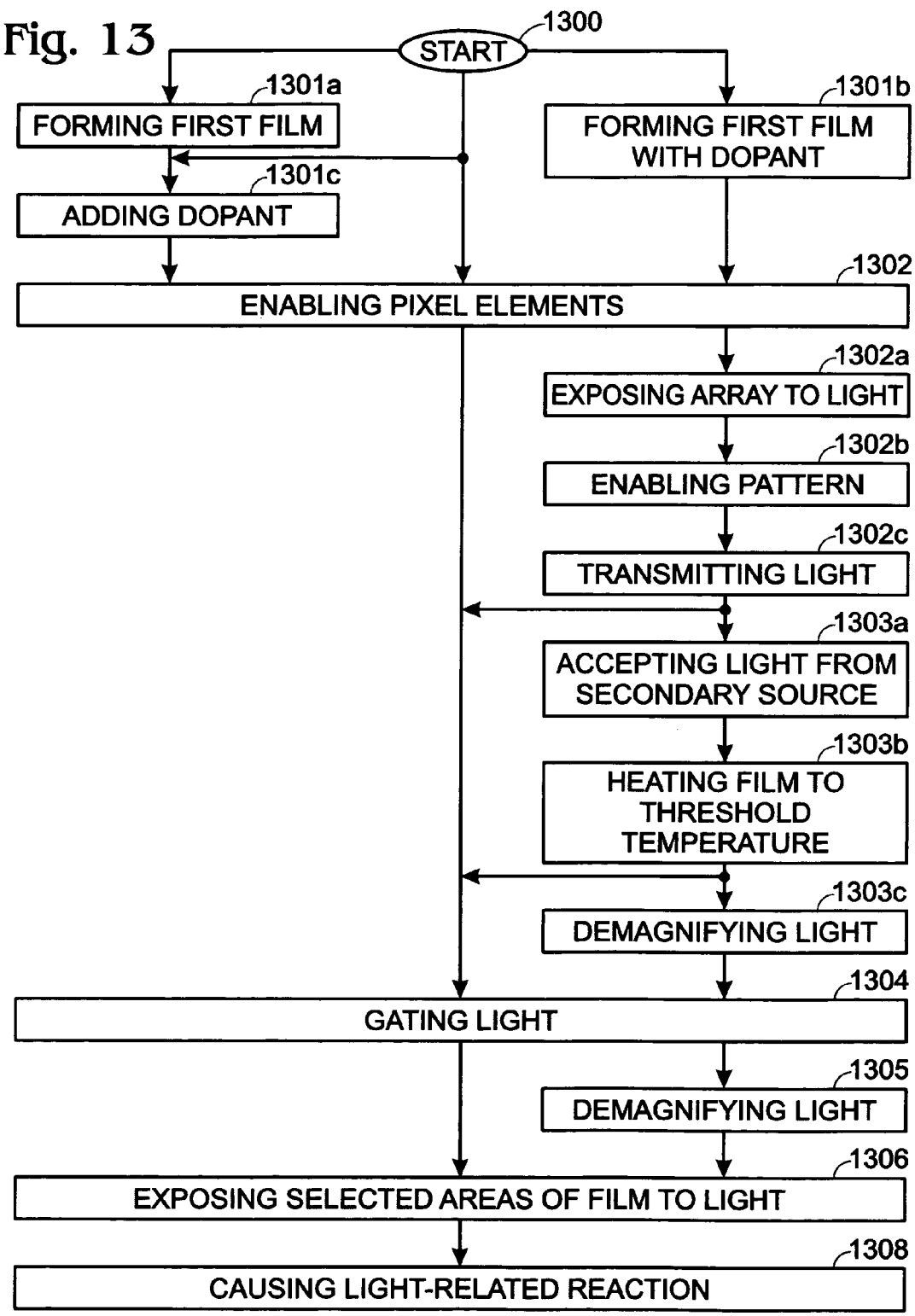

SYSTEM AND METHOD FOR DIGITAL LIGHT VALVE PROCESSING

RELATED APPLICATIONS

This application is a Continuation-in-part of a pending patent application entitled, DIGITAL LIGHT VALUE, invented by John Hartzell, Ser. No. 11/483,431 is a Divisional of U.S. Pat. No. 7,078,323, filed Jul. 10, 2006, which is incorporated herein by reference.

BACKGROUND OF THE INVENTION

1. Field of the Invention

This invention generally relates to integrated circuit (IC) and liquid crystal display (LCD) fabrication and, more particularly, to a system and method for performing light-related processes on semiconductor films using a digital light valve gating mechanism.

2. Description of the Related Art

The fabrication of electronic devices such as integrated circuits and thin film transistors requires many process steps, including deposition, etching, annealing, crystallization, and others. Each of these steps requires one or more energy sources applied to the substrate, and/or neighboring material, to complete the process. Many of these processes also require a photolithography step to isolate the area to be processed. Photolithography and masking steps are very costly manufacturing processes.

FIGS. 17A and 17B illustrate, respectively, a conventional laser crystallization lateral growth process and a mask used in support of such a process (prior art). A laser source is conventionally used to crystallize amorphous silicon (a-Si) on temperature sensitive substrates, such as glass or plastic, in the manufacture of LCDs. A mask permits selected areas of Si to be heated to melting, without degrading the underlying substrate. One conventional process, known as Sequential Lateral Solidification (SLS) or Laser-Induced Lateral Growth, uses a mask to sequentially expose adjacent strips of a-Si to laser light, crystallizing the a-Si into polycrystalline Si (poly-Si). The poly-Si is used to fabricate electrical devices, such as TFTs for display applications. Alternately, polysilicon materials can be used in the manufacture of mechanical and photonic devices.

The prior methods for SLS or lateral crystallization use a mask to form the laser beam into beamlets that are directed on the substrate. These beamlets are effectively scanned in a stepping motion across a substrate producing a laterally crystallized polysilicon material. This polysilicon material on substrate is typically used to fabricate TFT array backplanes for display products. There are two major problems with this method. The material electrical properties of transistors, with channels parallel to the scan direction of the laser beam, are of a very high quality. However, the material electrical properties of transistors, with channels running perpendicular to the scan direction of the laser beam, are only approximately 50% of those with channels parallel to the scan direction. Thus, large non-uniformities in the characteristics of thin film transistors that are perpendicular to each other. This non-uniformity results in a low quality display, due to the non-uniformity of discreet pixel TFTs and non-uniformities between TFTs making up circuit elements.

Further, the masks used to form the laser beamlets are expensive and susceptible to damage over time. In addition, a manufacturer may be required to use many masks to process different types of crystallization. For example, masks with different slit widths are used to promote different crystallization results. It is also known to use a sequential series of different masks. Specialized masks combining different slit widths and directions are also used for particular applications. All these specialized masks, in turn, require unique reticles and mask fabrication processes. Thus, for particular crystallization applications, the expenses associated with the initial cost of the masks, and the process steps of changing masks, can be prohibitive.

It would be advantageous if light-related operations could be performed on selective areas of a semiconductor film without using a mask or photoresist.

SUMMARY OF THE INVENTION

This application describes to use of a light valve to control the delivery of light to a substrate surface. In combination with a laser or other light source, and a motion control system, the light valve can be used in the fabrication of electronic, mechanical, and/or photonic devices without the necessity of a mask or photolithography. The light source, digital light valve, and motion control system deliver discreet packets of energy to a precise location on a substrate in order to carry out light-related processes that require energy.

A typical example of a process requiring a localized annealing step requires that a reticle be created; a mask formed from the reticle; the mask be mounted for an annealing process; and, the mask be dismounted after annealing. The invention described herein supports light-related film processes, while eliminating the need to build, mount, and dismount the mask. The reduced number of process steps and mask fabrication results in a reduction of process steps.

Accordingly, a method is provided for processing a semiconductor film using a digital light valve. The method enables pixel elements from an array of selectable pixel elements; gates a light in response to enabling the pixel elements; exposes selected areas of a semiconductor film, such as Si, to the gated light; and, creates light-related reactions in the semiconductor film, in response to the light exposure. More specifically, enabling pixel elements from an array of selectable pixel elements may include: exposing a digital light valve array of selectable pixel elements to the light; enabling a pattern of pixel elements; and, transmitting light from the pattern of enabled pixel elements.

In another aspect of the method, the semiconductor film is heated to a minimum threshold temperature, for example using a flood light source, such as an excimer lamp, or laser, such as CO2 laser. Then, the semiconductor film is processed in response to the minimum threshold-heated semiconductor film absorbing the gated light.

One example of a light-related reaction is that of changing the topology of a film surface, which may involve decreasing surface roughness, increasing surface roughness, creating depressions in the surface, or creating vertical structures extending from the surface. Other examples of light-related reactions include creating a chemical reaction, diffusing a dopant, activating a dopant, alloying the semiconductor film, and changing the semiconductor crystalline structure.

Additional details of the above-described method and a digital light valve system for processing semiconductor film are provided below.

BRIEF DESCRIPTION OF THE DRAWINGS

FIG. 4 is a partial cross-sectional view of the digital light valve of FIG. 2, where each pixel element is a mirror that reflects light when enabled.

FIG. 5 is a partial cross-sectional view of the digital light valve of FIG. 2, where pixels pass (transmit) light.

FIG. 6 is a partial cross-sectional view of the digital light valve of FIG. 2, where the pixel elements are mirrors that can be focused.

FIG. 7 is a plan view of the semiconductor film surface of FIG. 1 illustrating an exemplary gated light sequence.

FIG. 10 is a plan view of a semiconductor film surface illustrating perpendicular directional processes.

FIGS. 11A through 11D are drawings illustrating the modulation aspect of the light valve system.

FIG. 13 is a flowchart illustrating a method for processing a semiconductor film using a digital light valve.

DETAILED DESCRIPTION OF THE PREFERRED EMBODIMENTS

Figure 1:
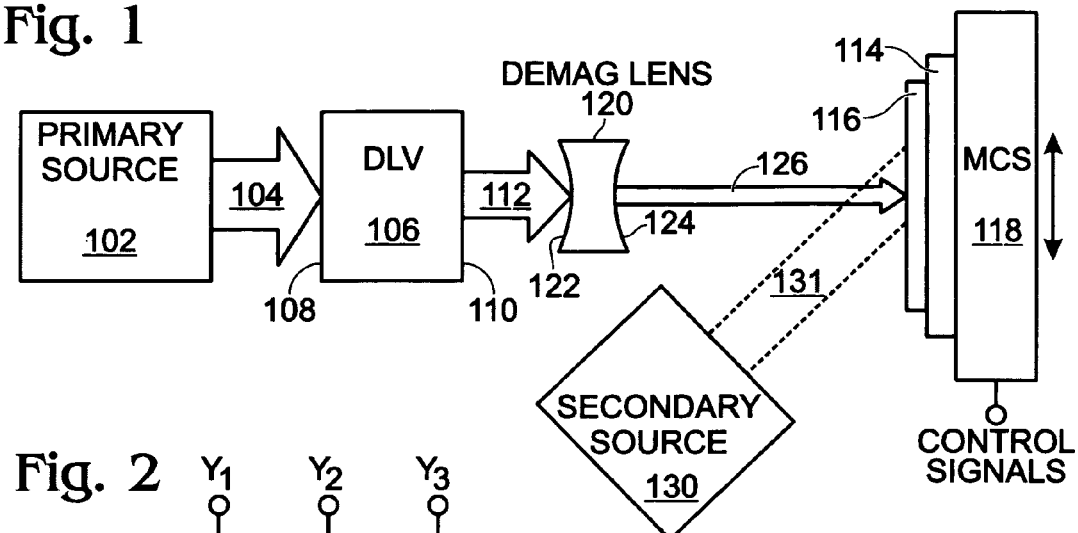
FIG. 1 is a schematic block diagram of a digital light valve system for creating light-related semiconductor process reactions.

FIG. 1 is a schematic block diagram of a digital light valve system for creating light-related semiconductor process reactions. The system 100 comprises a primary light source 102 supplying light 104. For example, the primary source 102 can be a coherent or substantially coherent laser light source operating at a wavelength in the range of approximately 150 to 1500 nanometers (nm), using of the following lasers: 1000 nm ($CO_2$), 308 nm (XeC), 351 nm (XeF), 248 nm (KrF), 193 nm (ArF), or a 2nd and $3^{rd}$ harmonic (ND:YAG) 533/353 (150-500) nm. Other wavelengths are also possible, and light need not be coherent. Further, the light source 102 need not be a laser. A digital light valve (DLV) 106 has an interface 108 to accept the light and an interface 110 to supply light 112 gated in a sequential pattern. A substrate carrier 114 is provided for mounting a semiconductor film 116, located in the path of the gated light 112. Typically, a motion control subsystem (MCS) 118 is used to control the position light valve 106 with respect to the substrate carrier 114. As shown, the motion control subsystem 118 is shown connected to the substrate carrier 114, to move the carrier 114. Alternately but not shown, the motion control subsystem could be connected to the light valve 106, or to both the light valve and the substrate carrier 114. Light-related reactions are created on selected areas of the semiconductor film 116 in response to exposure to the gated light. The semiconductor film 116 may be a silicon (Si), a silicon-containing film, Ge, SiGe, carbide, an oxide, nitride, or dielectric material. The term "semiconductor film" is intended to cover any material that is used in conventional thin-film processes.

Figure 2:
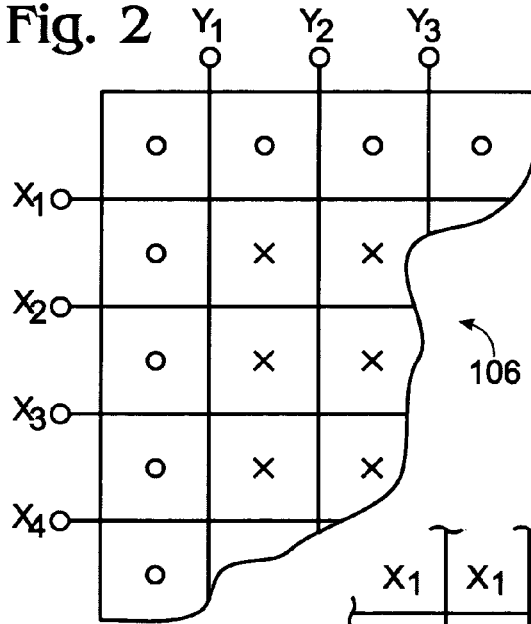
FIG. 2 is a plan view illustrating an exemplary digital light valve.

FIG. 2 is a plan view illustrating an exemplary digital light valve. The light valve includes a plurality of pixels or pixel elements that selectively gate light, either by transmission or reflection. The light valves can be selected using an X-Y matrix of control lines, such as might be used to enable LCD pixels or read/write memory cells. The light valve is called digital in consideration that each pixel can be individually controlled. The digital light valve 106 can take a number of different forms. For example, the digital light value can be enabled using microelectromechanical switch (MEMS) mirror arrays, such as those made by Texas Instruments or Silicon Light Machines. The mirror and array sizes, switching speeds, and tolerable light fluence levels make these commercially available light valves candidates for this process scheme. The "X" marking represents enabled pixel elements, while the "O" markings represent pixels that are not enabled. The pixel elements are shown as square, however, they may also be rectangular, circular, or oval in shape. The pixel elements are not limited to any particular shape. In one aspect, the length (or width, or diameter) of each pixel element can be in the range of 1 to 200 microns.

Figure 3:
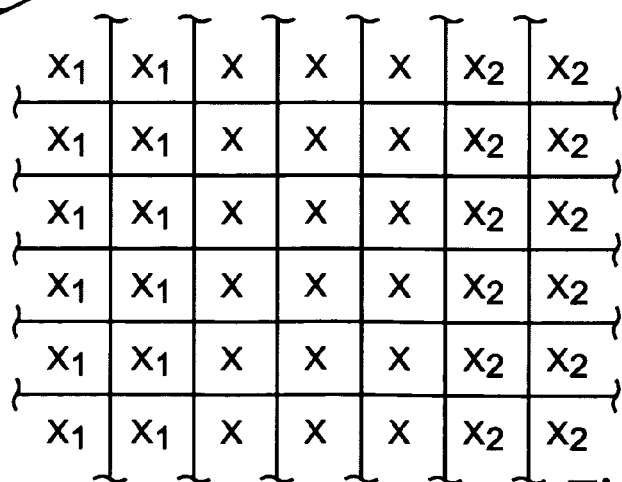
FIG. 3 is digital light valve of FIG. 2, showing a sequence of enabled pixel elements.

FIG. 3 is digital light valve of FIG. 2, showing a sequence of enabled pixel elements. The "X1" markings represent pixels enabled in a first sequence, the "X2" markings represent pixels enabled in a second sequence, and the "X" markings represent pixels enabled in both the first and second sequence. Such a sequence might be used in a lateral growth laser annealing process, when a laser shot, or series of laser shots, is significantly longer than the length of a single pixel element. The enable/disable switching speed can as great as 20 megahertz, which is more than sufficient to support a typically laser shot repetition rate in the range of 0.1 to 500 kilohertz.

For example, the pixel elements may be 15 microns sq, and the lateral growth lateral growth length in the semiconductor film is 80 to 100 microns. Then, a 5 (length) by 10 (width) pixel area is radiated every laser shot, with shift of 2 pixels in the length direction (approximately half the growth length) every shot, assuming a demagnification lens is not being used. Note, only a 6-pixel width area is shown in the figure.

In one aspect, two or more pixel enablement sequences are performed in the course of a single laser shot. That is, a plurality of sequences can be enabled during a single laser shot. For example, the pixel elements in a region can be modulated on and off at a particular frequency. In another example, a "wave" or "ripple" type of sequence pattern can be created. The system is not limited to any particular type of sequence pattern. Further, the sequence need not necessarily use on/off (0/100%) enabled pixel elements, but rather a gray scale of transmission values in a range between 0 and 100%. For example, a single pixel element can be enabled for a three-step sequence of 0, 50%, and 100% transmission.

FIG. 4 is a partial cross-sectional view of the digital light valve of FIG. 2, where each pixel element is a mirror that reflects light when enabled. In one aspect, an enabled pixel element is the default condition, where enabled pixels are parallely aligned. For example, the enabled pixel elements may be aligned parallel to the light valve surface. Then, a pixel element is disabled by moving the pixel alignment away from a surface-parallel alignment. For example, a pixel can be disabled by causing incident light to reflect a predetermined angle different from the light reflected by enabled pixel elements. That is, the disabled pixel elements diffract incident light by being angled from a normal default enable position.

Alternately, the pixels are enabled by moving the pixel alignment a predetermined angle from the DLV surface. Note, the positioning of the DLV and DLV surface may be important in the gating of light from enabled pixels.

FIG. 5 is a partial cross-sectional view of the digital light valve of FIG. 2, where pixels pass (transmit) light. As an alternate to mirrors, the light valve can operate by passing or transmitting light through selected pixel regions 200, instead of reflecting it. In another aspect, the light valve can block light through selected pixels 202 (transmission is the default condition). In another variation, the pixel element 204 is a film that transmits or attenuates incident light in response to an electrical or chemical stimulus. For example, the transmission characteristics of the film itself can be controlled. As shown, pixel 204a is passing light, while pixel 204b is attenuating incident light. Alternately, the film transmission characteristics of pixel 206 can be controlled by deforming the film surface, or otherwise controlling the angle at which incident light hits the film surface. Pixel 206b is blocking incident light, while pixel 206b is passing it. In another variation (see pixel 208), the transmission (attenuation) characteristics need not necessarily be binary (on/off). That is, a gray scale or graduated transmission of light may be supplied at a number of discrete levels between 0 and 100%. For example, a pixel element may be selectively enabled to transmit incident light at 0, 33, 50, 67, 80, or 100%.

FIG. 6 is a partial cross-sectional view of the digital light valve of FIG. 2, where the pixel elements 200 are mirrors that can be focused. As an another alternative, instead of a on/off mirror array, a mirror array can be used that focuses light, so that the gated light on one particular film area may be the combination of a number of mirrors (pixels) angled to focus on the particular film area. Such a gating arrangement enables mirror pixel elements to transmit incident light in a gray scale of values. Note, if the pixel surfaces or distances between pixels are large with respect to the light wavelength, care must be taken with phase relationship between the combined gated light paths.

Returning to FIG. 1, in one aspect of the system 100 a demagnification lens 120 has an input 122 to accept the gated light 108 from the digital light valve 106 and an output 124 to supply demagnified gated light 126 to the substrate carrier 114. Advantageously, this aspect of demagnification lens 120 reduces the heat load on the light valve, concentrating the gated output on a reduced area of semiconductor film. Alternately but not shown, the demagnification lens input 122 accepts light 104 from the primary light source 102 and its output 124 supplies demagnified gated light to the digital light valve 106. Advantageously, this aspect of the demagnification lens 120 treats a larger area of semiconductor film than the other demagnification lens arrangement.

In some aspects, a secondary light source 130, such as a flood light source, such as an excimer lamp, or a laser, such as a CO2 laser, supplies light 131 to the substrate carrier 114. The secondary light source 130 permits the semiconductor film 116 to be heated to a minimum temperature. Alternately, a more diffuse energy source, such as an oven, can be used as a secondary source. As a result of secondary heating, the process threshold temperature can be achieved with a lower heat load on the light valve, or the gated light energy can be distributed across a larger region of semiconductor film.

FIG. 7 is a plan view of the semiconductor film surface of FIG. 1 illustrating an exemplary gated light sequence. As shown, the digital light valve supplies light gated in a first direction 300 along a surface 302 of the semiconductor film 116. Simultaneously, gated light is supplied in a second direction 304, different than the first direction 300, along the surface 302 of the semiconductor film 116. The sequence moves with each laser shot. Laser shots X1, X2, and X3 are shown. The first and second directions are shown as orthogonal, but they need not necessarily be so. The laser shots are shown as originating from a common region (X1), but they need not be so (see FIG. 10 for example). As a result, light-related processes are performed in the semiconductor film 116 simultaneously in the first direction 300 and second direction 304.

Figure 8:
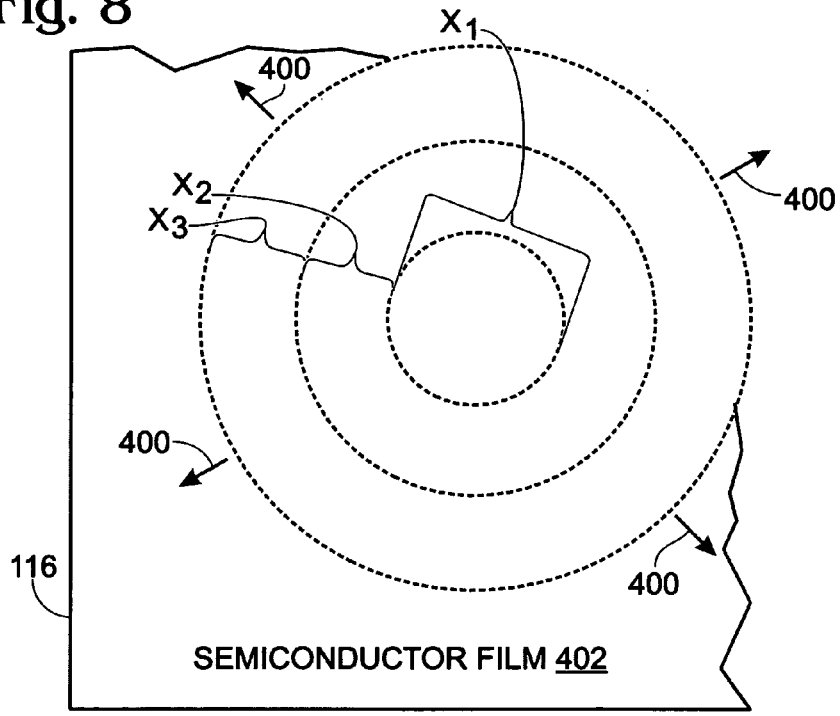
FIG. 8 is a plan view of the semiconductor film surface of FIG. 1 illustrating another exemplary gated light sequence.

FIG. 8 is a plan view of the semiconductor film surface of FIG. 1 illustrating another exemplary gated light sequence. Here, the digital light valve supplies light gated in an outwardly radial pattern 400 on a surface 402 of the semiconductor film 116. That is, the direction 400 is outward from a center point 404. The dotted lines represent the outward boundaries of 3 laser shots; X1, X2, and X3.

FIGS. 7 and 8 depict light sequences, which may be desirable for some processes (e.g., lateral growth crystallization). However, light sequences are not necessarily used in all semiconductor processes, and the system is not limited to just the use of sequential light exposure patterns.

Functional Description

Figure 9:
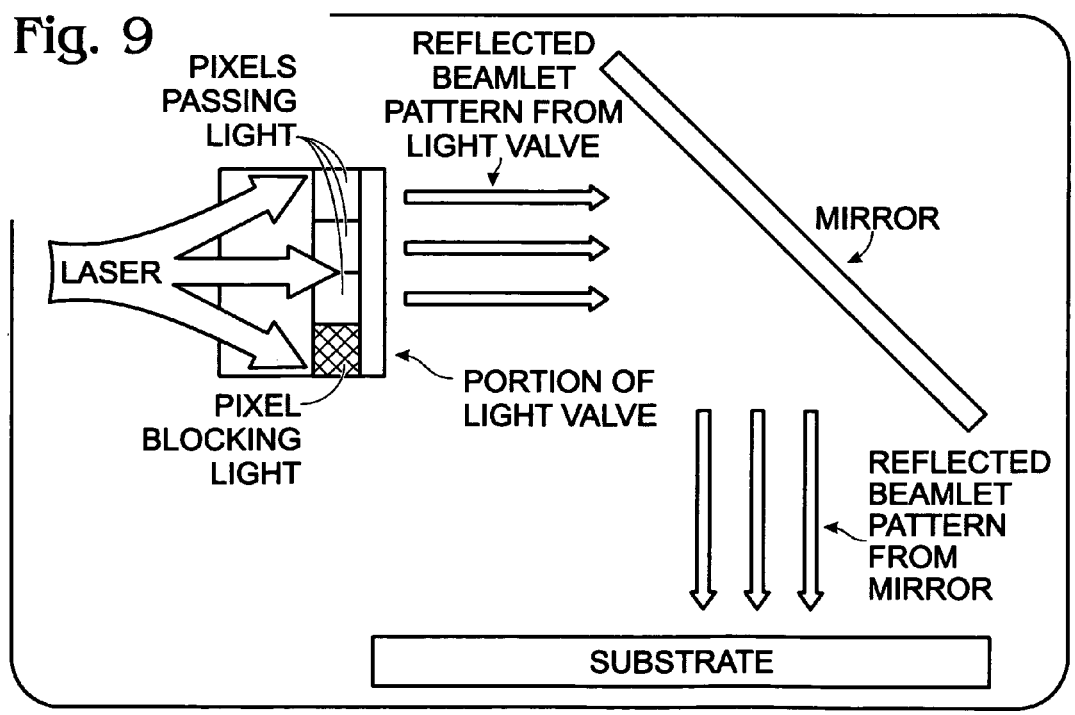
FIG. 9 is a schematic block diagram illustrating another aspect of the light valve semiconductor processing system.

FIG. 9 is a schematic block diagram illustrating another aspect of the light valve semiconductor processing system. The use of the above-described light valve eliminates masking requirements, while permitting localized process steps. The light valve eliminates the need for photolithography or a mask during some device fabrication processing steps. The basic idea is to direct a laser, or other high intensity light beam, through appropriate optical elements and into a light valve. The light valve breaks the laser beam up into digitally controlled optical "pixel" elements in a grid formation. The beam exits the light valve and may be directed through additional optical elements, which may include a projection lens to de-magnify the beam image.

The advantage of the demagnification step is twofold: 1) reduction of the energy density of the beam in the light-valve, which might damage the light-valve, by magnifying the resulting energy fluence at the process substrate; and 2) increasing the resolution of the image on the process substrate. Once the beam "pixel elements" exit the light value, they strike the substrate in a pattern appropriate for the process being carried out.

Since the individual pixel elements can be controlled by the driving circuitry of the light valve, the elements can either pass light or block light. The process substrate is mounted on a stage or substrate carrier, which accurately controls motion in one or more directions, and can be maneuvered in front of the light valve. In this fashion, a computer-controlled system can accurately control the delivery of discrete packets of light energy to selected areas of the process substrate. This process allows the user to carry out "localized" thermal, chemical, and photonic reactions on the process substrate.

This invention eliminates or reduces the need for photolithography or masking steps during processing. Possible process steps that can use this invention include crystallization, deposition, etch (ablation), anneal, and dopant activation. One of the aspects of this invention has to with delivering the energy necessary to carry out the desired process. In the case of the annealing of amorphous silicon into polysilicon, the reaction is a "threshold" type of reaction. That is: the melting and crystallization of the a-Si takes place above a threshold temperature. Below this temperature, the reaction either does not take place, or the time necessary to carry out the process is much longer. In the case of the crystallization of a-Si into polysilicon, the melt temperature of a-Si is around 1500° C. and the laser crystallized film must reach this temperature to complete this process in the typical, very short, timeframe, in the tens of nanoseconds. The crystallization process can take place at a lower temperature, however, if the Si is not melted. A sub-melting temperature solid phase crystallization (SPC) requires a process time on the order of hours. To reach the required temperature for laser-annealed polysilicon, a very high dose of laser energy is required. If this high energy, or high laser fluence, is passed directly through the light valve, it might damage the light valve.

Therefore, in one aspect the area being processes is exposed to two energy sources. A secondary source (flood source) heats the desired process area to, or below the threshold temperature. The primary source controlled by the digital light valve (primary source) supplies the remaining energy necessary to exceed the process minimum requirements in the desired process areas. This flood source may take many forms and may flood the entire substrate within the irradiation area, or it may be directed by a beam reduction scheme, such as a mask, into discreet areas. The primary source, directed through the light valve, supplies additional energy to selected areas. These selected areas are taken above the threshold temperature. Thus, the digital light valve can precisely control where the process is carried out. Note, the use of the terms "primary" and "secondary" is arbitrary.

Figures 10, 11A:
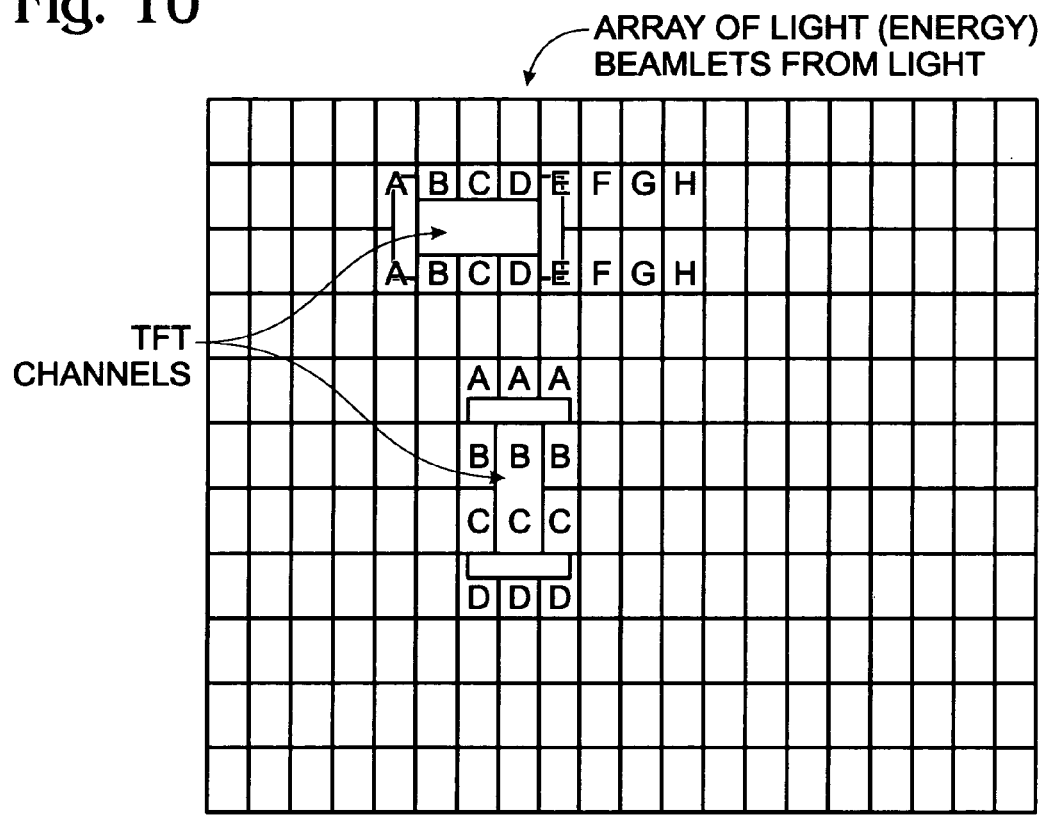

FIG. 10 is a plan view of a semiconductor film surface illustrating perpendicular directional processes. The digital light valve array can sequentially activate pixels in any direction and support light-related reactions in multiple directions at once. Shown are two TFT's whose channels are oriented perpendicular to each other. In this scheme, the process pixels are activated to allow beamlets of laser energy in the following sequence:

1) Pixels labeled A, B, and C;
2) Pixels labeled B, C, and D;
3) Pixels labeled C, D, and E; and,
4) Pixels labeled D, E, and F.

In this way, a localized doping diffusion process (for example) may occur in two different directions. The mask design that is used to layout the various thin films in the TFT process can be utilized to develop a program to control the laser tool to irradiate only the areas requiring diffusion.

FIGS. 11A through 11D are drawings illustrating the modulation aspect of the light valve system. As described above, pixels can be activated in sequences. The sequences can be moving in different directions. Further, the enablement of pixel elements in the activated sequence can be modulated. In some aspects, the pixel enablement duration is modulated. For example, the sequence may enable the center pixels longer than the pixels along the outside edges. As shown in FIG. 11A, center pixels X1 are enabled for a longer duration than pixels X2. FIG. 11B shows the next laser shot in the sequence. The entire sequence, including the longer duration (X1) pixels, has shifted 2 pixels to the right. Alternately, the pixels in a sequence may be enabled for a longer duration over just a certain area of film that is thicker than the surrounding areas, made from a different semiconductor material, or that requires a higher process temperature, or other mechanical quality.

The modulation may differentiate by position in the sequence. As shown in FIGS. 11C and 11D, the sequence may move to the right, with the leading edge shaped as an arrow. Further, the modulation may differentiate by the transmission characteristics of enabled pixels in the activated sequence. Returning to FIGS. 11A and 11B, the pixels in the center (X1) of the sequence may be enabled with a higher-energy fluence, for example, as a result of controlling the transmission characteristics of the enabled pixels.

Figure 12:
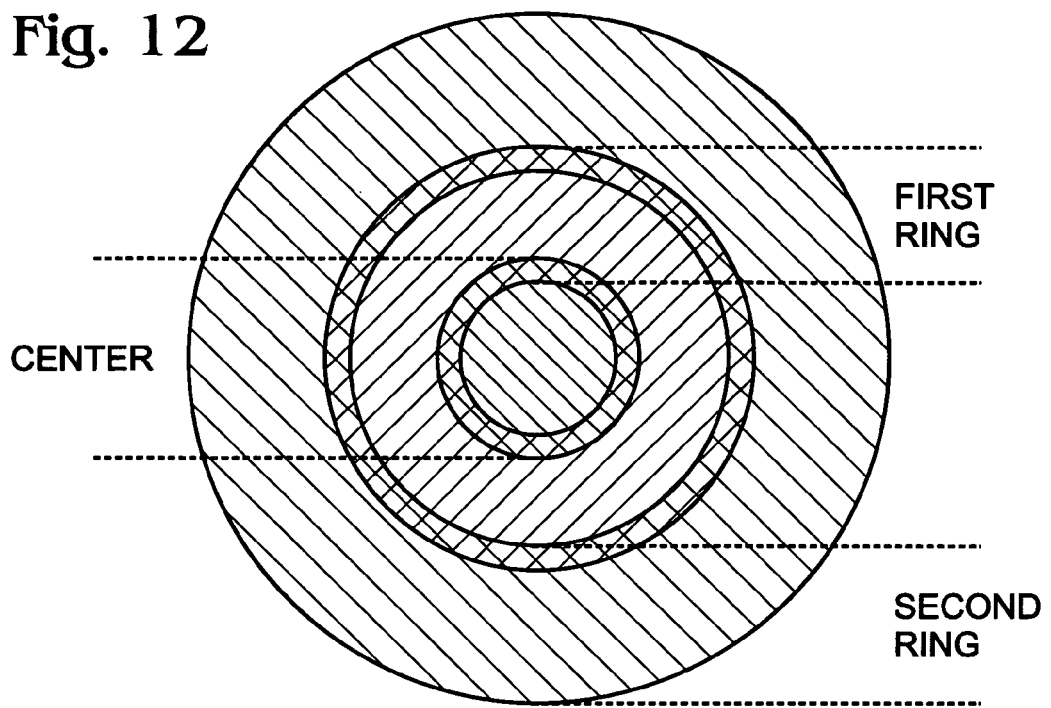
FIG. 12 is a plan view of a digital light valve illustrating an outwardly radial pixel enabling sequence.

FIG. 12 is a plan view of a digital light valve illustrating an outwardly radial pixel enabling sequence. More specifically, sequencing the enabled pixel elements radially outward from a center includes: enabling a center group of pixel elements defined by a perimeters; subsequently enabling a first ring of pixel elements having an inside circumference, inside the circle perimeter, and an outside circumference, outside the circle perimeter. Note, the center group perimeter and ring need not have the same shape, although they are both depicted as circular. Further, the center perimeter and ring shapes need not be circular. For example, either one, or both of the center perimeter and ring shapes may be square or rectangular.

The use of a light valve directing photonic energy to a small area in a substrate, to stimulate a reaction, is an important manufacturing technology. The implementation of this concept has been explained in detail for the case of laser crystallization, see pending parent application Ser. No. 11/483,431, filed Jul. 10, 2006, which is incorporated herein by reference. As described herein, this technology has a broader use than just crystallization, and can be applied to the manufacturing of integrated circuits and displays, and general nanotechnology processing.

One aspect of the invention is the ability to deliver a small packet of energy to a specific spot on a process substrate, and not deliver that energy to surrounding areas. In this way, distinct areas of unique materials, or materials with unique properties can be created. This process also enables unique follow-on processes to occur. In addition, these techniques can lower manufacturing costs. Some examples of this approach follow.

Figure 14:
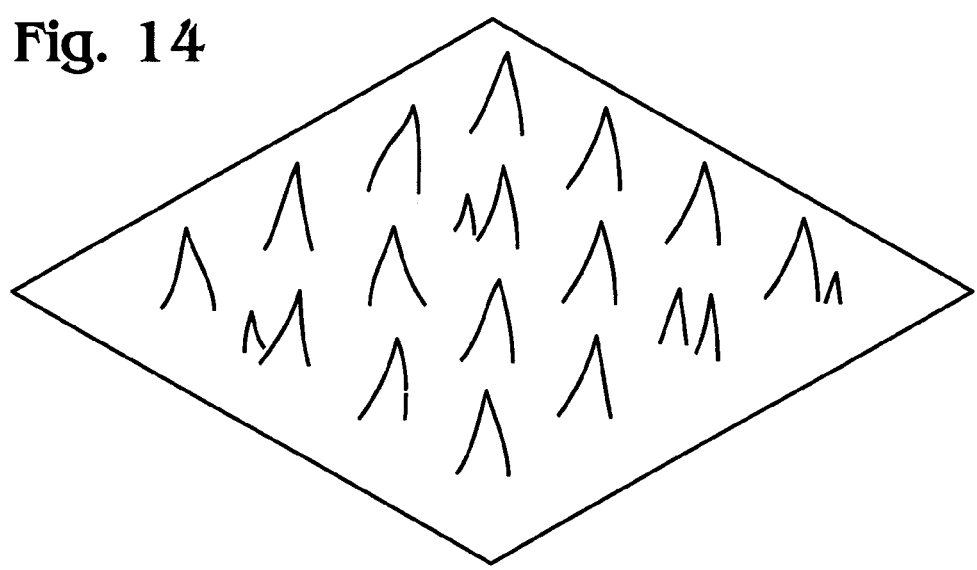
FIG. 14 is a perspective view of a semiconductor film with a semiconductor film surface morphology that has been modified as a result of laser annealing.

FIG. 14 is a perspective view of a semiconductor film with a semiconductor film surface morphology that has been modified as a result of laser annealing. The present invention process can be used to modify semiconductor film surface morphology—to create a surface that is a preferred surface for a particular reaction or process. For example, a particular surface may be desirable for a specific biological reaction. Biological materials are typically more stable with certain surface morphological conditions. Photonic energy can be directed to change the surface morphology, as shown.

Light-related processing can also be used to modify surface material properties. For example, a material may change its properties if it is heated to a certain level. One example is the change of an amorphous material to a nano or polycrystalline material. Another example is selective cross linking of organic molecules. Further, the hydrophobic or hydrophilic material properties of a thin film may be altered. In the case of the application of an aqueous material to a substrate, it may be desirable to create alternating regions of hydrophobic and hydrophilic surfaces. In that way, a liquid material will avoid one area and be attracted to another. This property may be desirable for ink jetting OLED materials or nano-materials, for example.

Figure 15:
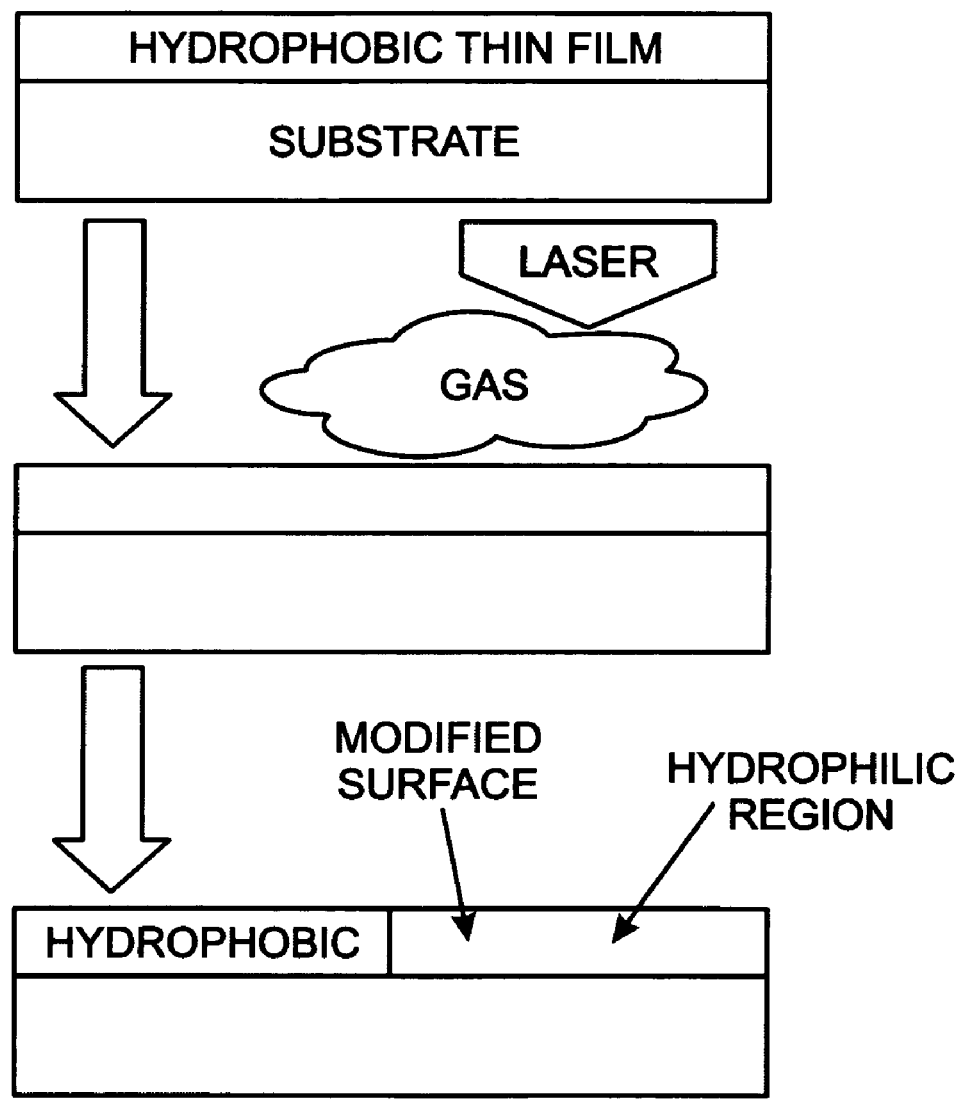
FIG. 15 is a sequence of partial cross-sectional drawings depicting the creation of a hydrophobic/hydrophilic pattern.

FIG. 15 is a sequence of partial cross-sectional drawings depicting the creation of a hydrophobic/hydrophilic pattern. This hydrophilic/hydrophobic material property change might be accomplished through another embodiment of the light-related processing technique: gas phase photonic processing, as shown.

In another aspect, the patterned alloying of materials may be accomplished. For example, two thin-film materials are deposited on a substrate. The delivery of sufficient energy to the surface causes the materials to join in an alloy, in the area of the energy coverage. Then, patterning is completed by removing the unreacted material.

Figure 16:
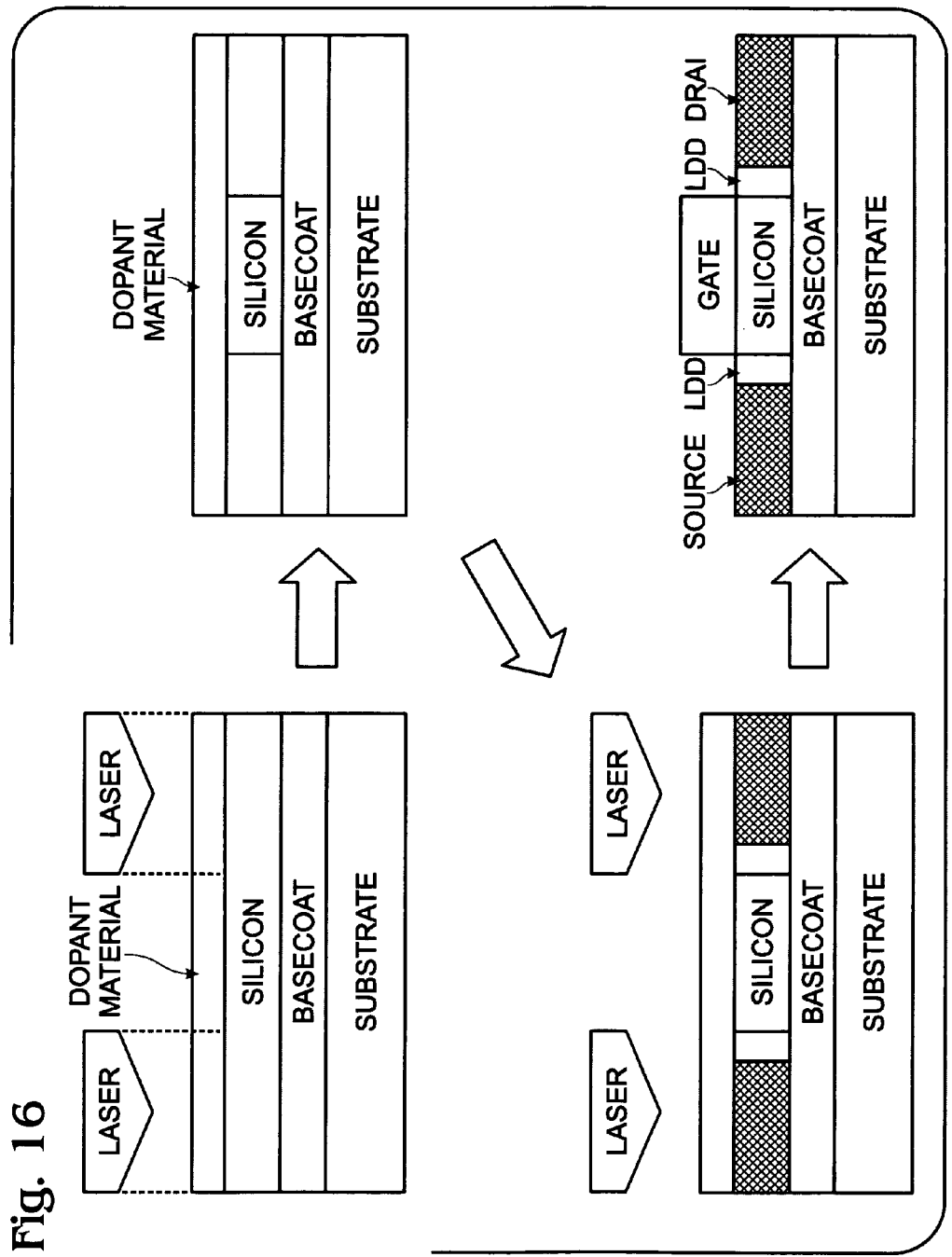
FIG. 16 depicts partial cross-sectional views of a light-related process for forming a thin-film transistor.
Figure 17A:
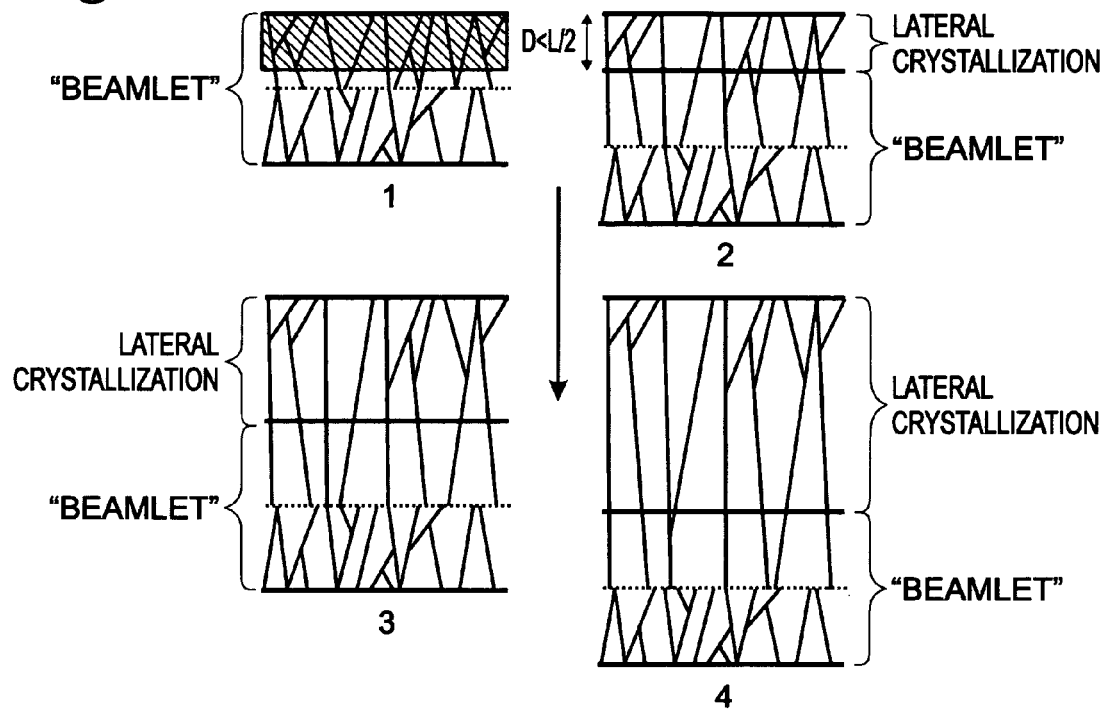
FIGS. 17A and 17B illustrate, respectively, a conventional laser crystallization lateral growth process and a mask used in support of such a process (prior art).
Figure 17B:
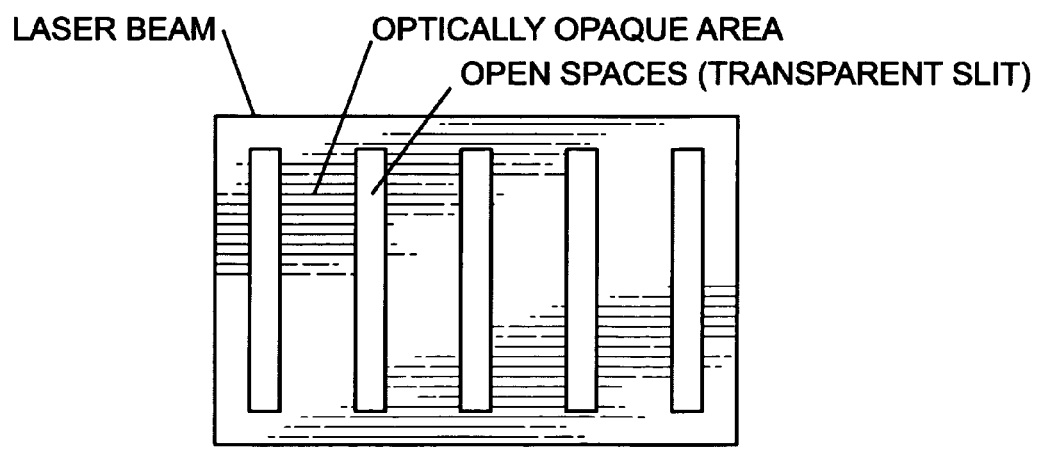

FIG. 16 depicts partial cross-sectional views of a light-related process for forming a thin-film transistor. The light-related processes can also be used to define device geometries. In the case of a discrete energy beam delivered to a device, device design is enabled by processing one specific area. For example, a dopant material may be activated in a thin-film transistor by using photonic energy, from a lamp or laser. The area of the device that is annealed by the light will have enhanced conduction properties. In the TFT structure, these areas can subsequently be defined as the source and drain areas of the device. This process can be used sequentially to form a more complex device, such as a device with a LDD (lightly doped drain) structure, by using sequential irradiations of light with different energy levels.

FIG. 13 is a flowchart illustrating a method for processing a semiconductor film using a digital light valve. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1300.

Step 1302 enables pixel elements from an array of selectable pixel elements. For example, the pixel elements may have a diameter in a range of about 1 to 200 microns. Step 1304 gates a light in response to enabling the pixel elements. For example the light can be a coherent or substantially coherent laser light source operating at a wavelength of approximately 1 micron or 1000 nanometers (nm) (CO2), 308 nm (XeC), 351 nm (XeF), 248 nm (KrF), 193 nm (ArF), or a 2nd and $3^{rd}$ harmonic (ND:YAG) 533/353 (150-500) nm. Typically then, Step 1304 gates light having a wavelength in the range between 150 and 1500 nanometers, although other wavelengths are also possible, and light need not be coherent. Further, the light source need not be a laser. Step 1306 exposes selected areas of a first (semiconductor) film to the gated light. Step 1308 creates a light-related reaction in the light-exposed areas of the first film.

In one aspect, enabling pixel elements in Step 1302 includes activating a sequence of enabled pixel elements, and exposing selected areas of the first film to gated light (Step 1306) includes sequentially exposing areas in response to the sequence of enabled pixel elements. In another aspect, enabling pixel elements from an array of selectable pixel elements in Step 1302 includes substeps. Step 1302a exposes a digital light valve array of selectable pixel elements to the light. Step 1302b enables a pattern of pixel elements. Step 1302c transmits light from the pattern of enabled pixel elements. As noted earlier, the light transmission may be controlled through reflection, non-reflection, passing through, and attenuation. Alternately, Step 1302c may transmit or pass light through the pattern of enabled pixel elements. In another alternative, Step 1302c blocks or attenuates light through the pattern of enabled pixel elements.

Optionally, an additional step (Step 1303b) heats the semiconductor film to a minimum threshold temperature in response to accepting light from a secondary light source. Then, Step 1308 creates the light-related reaction in response to the threshold-heated first film absorbing the gated light. For example, Step 1303a may accept light from a secondary, flood light source, and Step 1303b heats the semiconductor film to a minimum threshold temperature in response to the flood light source. The flood source can be an excimer lamp or laser for example.

In one aspect, Step 1303c, demagnifies the light, prior to it being gated in Step 1304. Alternately, Step 1305, subsequent to gating the light, demagnifies the gated light.

In another aspect, enabling pixel elements in Step 1302 includes modulating the enablement of pixel elements. Then, the light is gated (Step 1304) in response to modulating the enablement of pixel elements. For example, modulating the enablement of pixel elements may include an operation such as differentiating the duration, position, or transmission characteristics of enabled pixels.

Creating the light-related reaction in Step 1308 includes creating a reaction such as changing a topology of a film surface, creating a first film material chemical reaction, diffusing a dopant, activating a dopant, alloying the first film material, or changing the first film crystalline structure. For example, changing the first film surface topology may include decreasing surface roughness, increasing surface roughness, creating depressions in the surface, or creating vertical structures extending from the surface.

Alternately, creating a first film material chemical reaction may include: depositing a material overlying the first film with polymer chains; and, binding molecules in polymer chains, creating links between chains. In one aspect, Step 1301b forms a second material overlying the first film. For example, the second material may have a solid, liquid, or gas phase. Then, creating the film material chemical reaction in Step 1308 includes: reacting the first film material with the second material; and, creating a third material.

In anther aspect, Step 1301b forms the first film with a dopant, overlying a substrate, and Step 1308 diffuses dopant from the first film into the substrate.

In a different aspect, Step 1301a forms the first film, and Step 1301c adds a dopant to the first film. Then, Step 1308 activates the dopant by heating the dopant with sufficient energy to make the dopant electrically active in the first film.

A system and method for semiconductor film light-related processing has been presented using a digital light valve. A few examples of pixel elements and enablement patterns have been given to illustrate the invention. However, the invention is not limited to merely these examples. Further, examples of light-related digital light valve processes have been presented, but it should be understood that the invention is applicable to other IC and LCD processes that conventionally use heat or light, in combination with either photoresist or a laser mask. Thus, the invention can be used to support a host of localized chemical or mechanical processes. Other variation and embodiments of the invention will be understood by those skilled in the art.

I claim:

1. A method for processing a semiconductor film using a digital light valve, the method comprising:
    accepting light from a primary light source;
    enabling pixel elements from an array of selectable pixel elements;
    in response to enabling the pixel elements, gating the light;
    exposing selected areas of a first film to the gated light;
    heating a pattern of light-exposed areas in the first film to a threshold temperature; and,
    creating a light-related reaction in the light-exposed areas of the first film in response to the threshold-heated first film absorbing the gated light.

2. The method of claim 1 wherein enabling pixel elements from an array of selectable pixel elements includes:
    exposing a digital light valve array of selectable pixel elements to the light;
    enabling a pattern of pixel elements; and,
    transmitting light from the pattern of enabled pixel elements.

3. The method of claim 1 further comprising:
    accepting light from a flood light source and, wherein heating the first film to the threshold temperature includes heating to a threshold temperature in response to the flood light source.

4. The method of claim 1 wherein enabling pixel elements includes enabling pixel elements having a diameter in a range of about 1 to 200 microns.

5. The method of claim 1 further comprising:
prior to gating the light, demagnifying the light.

6. The method of claim 1 further comprising:
subsequent to gating the light, demagnifying the gated light.

7. The method of claim 1 wherein gating a light in response to enabling the pixel elements includes gating a light having a wavelength in a range between about 150 and 500 nanometers.

8. The method of claim 1 wherein enabling pixel elements includes modulating the enablement of pixel elements; and,
wherein gating the light source includes, modulating a gated light sequence in response to modulating the enablement of pixel elements.

9. The method of claim 8 wherein modulating the enablement of pixel elements includes an operation selected from the group including differentiating the duration, position, and transmission characteristics of enabled pixels.

10. The method of claim 1 wherein enabling pixel elements includes activating a sequence of enabled pixel elements; and,
wherein exposing selected areas of the first film to gated light includes sequentially exposing areas in response to the sequence of enabled pixel elements.

11. The method of claim 1 wherein creating the light-related reaction includes creating a reaction selected from a group including changing a topology of a film surface, creating a first film material chemical reaction, diffusing a dopant, activating a dopant, alloying the first film material, and changing the first film crystalline structure.

12. The method of claim 11 wherein changing the topology of the first film surface includes creating a first film surface topology selected from a group consisting of decreasing surface roughness, increasing surface roughness, creating depressions in the surface, and creating vertical structures extending from the surface.

13. The method of claim 11 wherein creating the first film material chemical reaction includes:
depositing a material overlying the first film with polymer chains; and,
binding molecules in polymer chains, creating links between chains.

14. The method of claim 11 further comprising:
forming a second material overlying the first film; and,
wherein creating the film material chemical reaction includes:
reacting the first film material with the second material; and,
creating a third material.

15. The method of claim 14 wherein forming the second material overlying the first film includes forming a second material with a phase selected from a group consisting solid, liquid, and gas.

16. The method of claim 11 further comprising:
forming the first film with a dopant, overlying a substrate; and,
wherein diffusing the dopant includes diffusing dopant from the first film into the substrate.

17. The method of claim 11 further comprising:
forming the first film
adding a dopant to the first film; and,
wherein activating the dopant includes heating the dopant with sufficient energy to make the dopant electrically active in the first film.

* * * * *